United States Patent
Dai et al.

(10) Patent No.: US 10,976,879 B2
(45) Date of Patent: Apr. 13, 2021

(54) METHOD OF MANUFACTURING A TOUCH PANEL AND TOUCH PANEL

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Weinan Dai, Beijing (CN); Hwang Kim, Beijing (CN); Yangsheng Liu, Beijing (CN); Mengxia Kong, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 16/129,980

(22) Filed: Sep. 13, 2018

(65) Prior Publication Data
US 2019/0087034 A1 Mar. 21, 2019

(30) Foreign Application Priority Data
Sep. 15, 2017 (CN) .......................... 201710835484.5

(51) Int. Cl.
*G06F 3/044* (2006.01)
*H01L 27/32* (2006.01)
*H01L 51/52* (2006.01)

(52) U.S. Cl.
CPC .......... *G06F 3/0445* (2019.05); *G06F 3/0446* (2019.05); *H01L 27/323* (2013.01);
(Continued)

(58) Field of Classification Search
CPC . G06F 2203/04103; G06F 2203/04107; G06F 2203/04111; G06F 3/044;
(Continued)

(56) References Cited

U.S. PATENT DOCUMENTS

2013/0081869 A1* 4/2013 Kim ........................ G06F 3/044
174/261
2014/0092325 A1* 4/2014 Chen ..................... G06F 3/0416
349/12
(Continued)

FOREIGN PATENT DOCUMENTS

CN 102651340 A 8/2012
CN 102662548 A 9/2012
(Continued)

OTHER PUBLICATIONS

First Office Action issued in Chinese Application No. 201710835484. 5, dated Feb. 3, 2020, with English translation.

*Primary Examiner* — Afroza Chowdhury
(74) *Attorney, Agent, or Firm* — McDermott Will & Emery LLP

(57) ABSTRACT

A method of manufacturing a touch panel includes forming a first touch electrode layer including first touch electrodes, first touch traces and first pins, and the first pins are located in the first pin bonding area of the touch panel. The method further includes depositing an interlayer insulating layer by using a first mask including a first shielding structure, and the first shield structure is configured to shield a first pin bonding area. The method further includes forming a second touch electrode layer including second touch electrodes, second touch traces and second pins, and the second pins are located in a second pin bonding area of the touch panel.

16 Claims, 10 Drawing Sheets

(52) U.S. Cl.
CPC .............. *G06F 2203/04103* (2013.01); *G06F 2203/04107* (2013.01); *G06F 2203/04111* (2013.01); *H01L 51/5281* (2013.01)

(58) Field of Classification Search
CPC ... G06F 3/0445; G06F 3/0446; H01L 27/323; H01L 51/5281
See application file for complete search history.

(56) References Cited

U.S. PATENT DOCUMENTS

| | | | |
|---|---|---|---|
| 2014/0154823 A1 | 6/2014 | Liu et al. | |
| 2014/0313440 A1* | 10/2014 | Hsu | G06F 3/044 349/12 |
| 2015/0062454 A1* | 3/2015 | Hao | G06F 3/044 349/12 |
| 2015/0212632 A1* | 7/2015 | Wang | G06F 3/044 345/173 |
| 2015/0301640 A1* | 10/2015 | Tsurusaki | G06F 3/044 345/175 |
| 2016/0018927 A1 | 1/2016 | Ding et al. | |
| 2016/0041644 A1* | 2/2016 | Bae | G06F 3/0446 345/174 |
| 2016/0041647 A1* | 2/2016 | Bae | G06F 3/044 345/174 |
| 2016/0062520 A1 | 3/2016 | Choi | |
| 2016/0162069 A1* | 6/2016 | Du | G06F 3/044 345/174 |
| 2016/0291759 A1* | 10/2016 | Kurasawa | G06F 3/0416 |
| 2016/0299594 A1* | 10/2016 | Zhang | G06F 3/041 |
| 2016/0308132 A1 | 10/2016 | Chan et al. | |
| 2016/0370892 A1* | 12/2016 | Chang | G06F 3/0416 |
| 2016/0378216 A1* | 12/2016 | Lee | G06F 3/0416 345/173 |
| 2017/0108979 A1* | 4/2017 | Lu | G06F 3/041 |
| 2018/0039360 A1* | 2/2018 | Akimoto | G06F 3/0412 |
| 2018/0181240 A1* | 6/2018 | Heo | G06F 3/0412 |
| 2018/0247807 A1 | 8/2018 | He et al. | |

FOREIGN PATENT DOCUMENTS

| | | |
|---|---|---|
| CN | 103455203 A | 12/2013 |
| CN | 105390526 A | 3/2016 |
| CN | 106847827 A | 6/2017 |
| CN | 106919284 A | 7/2017 |

* cited by examiner

METHOD OF MANUFACTURING A TOUCH PANEL AND TOUCH PANEL

CROSS-REFERENCE TO RELATED APPLICATION

This application claims priority to Chinese Patent Application No. 201710835484.5, filed on Sep. 15, 2017, titled "METHOD OF MANUFACTURING A TOUCH PANEL AND TOUCH PANEL", which is incorporated herein by reference in its entirety.

TECHNICAL FIELD

The present disclosure relates to the field of touch display technologies, and in particular, to a method of manufacturing a touch panel and a touch panel.

BACKGROUND

A touch display device is a device which can achieve both display and touch. The touch display device generally includes a display panel and a touch panel. According to the positional relationship between the touch panel and the display panel, the touch display device can be divided into a built-in touch display device and an out-cell touch display device (Out-cell). The built-in touch display device can be further divided into an in-cell touch display device (In-cell) and an on-cell touch display device (On-cell). Since the on-cell touch display device (On-cell) has the advantages of facilitating light weight and thinning of the touch display device and preventing the interaction between the display unit and the touch panel, it has been widely studied and applied.

SUMMARY

Some embodiments of the present disclosure provide a method of manufacturing a touch panel, comprising:

forming a first touch electrode layer comprising first touch electrodes, first touch traces and first pins, wherein, the first pins are located in a first pin bonding area of the touch panel;

depositing an interlayer insulating layer by using a first mask including a first shielding structure, during which the first shielding structure shields the first pin bonding area; and forming a second touch electrode layer comprising second touch electrodes, second touch traces and second pins, wherein, the second pins are located in a second pin bonding area of the touch panel.

In some embodiments, before forming the first touch electrode layer, the method of manufacturing the touch panel further comprises: providing a display panel, and the first shielding structure is further configured to shield a display bonding area of the display panel during deposition of the interlayer insulating layer.

In some embodiments, the first shielding structure comprises a first shielding portion configured to shield the first pin bonding area, and a second shielding portion configured to shield the display bonding area, or, the first shielding structure comprises a third shielding portion configured to shield both the first pin bonding area and the display bonding area.

In some embodiments, an orthographic projection of the first pin bonding area on the display panel and an orthographic projection of the display bonding area on the display panel are located at a same side edge of the display panel, and a side of the first pin bonding area adjacent to a display area of the display panel and a side of the display bonding area adjacent to the display area are flush.

In some embodiments, the first touch electrode layer further comprises first display stacking structures, a first display stacking structure of which is disposed on a display pin of the display panel, and the display pin is located in the display bonding area; and/or, the second touch electrode layer further comprises: second display stacking structures, a second display stacking structure of which is disposed on a first display stacking structure of the first touch electrode layer; and first pin stacking structures, a first pin stacking structure of which is disposed on a first pin of the first touch electrode layer.

In some embodiments, the second display stacking structure covers a surface of the first display stacking structure facing away from the display pin and side surfaces of the first display stacking structure adjoining the surface of the first display stacking structure; and the first pin stacking structure covers a surface of the first pin facing away from the display panel, and side surfaces of the first pin adjoining the surface of the first pin.

In some embodiments, after providing a display panel and before forming the first touch electrode layer, the method of manufacturing the touch panel further comprises:

depositing an etch stop layer by using a second mask including a second shielding structure, during which the second shield structure shields the display bonding area.

In some embodiments, the etch stop layer is made of an inorganic material.

In some embodiments, after forming the second touch electrode layer, the method of manufacturing the touch panel further comprises:

forming a protective layer which covers an area other than the first pin bonding area; the second pin bonding area and the display bonding area by using a spraying process.

In some embodiments, after forming the protective layer, the method of manufacturing the touch panel further comprises: forming a polarizing layer.

In some embodiments of the present disclosure; a process of forming the polarizing layer is a coating process.

In some embodiments, the first touch electrodes are touch transmitting electrodes, and the second touch electrodes are touch sensing electrodes.

Some embodiments of the present disclosure provide a mask used in the method of manufacturing the touch panel described above, and the mask comprises a first shielding structure configured to shield the first pin bonding area of the touch panel during formation of the interlayer insulating layer.

In some embodiments, the first shielding structure is further configured to shield a display bonding area of a display panel during deposition of an interlayer insulating layer.

Some embodiments of the present disclosure provide a touch panel manufactured by the above manufacturing method, and the touch panel comprises a first touch electrode layer, an interlayer insulating layer and a second touch electrode layer which are formed in order. The first touch electrode layer comprises first touch electrodes, first touch traces and first pins, and the first pins are located in the first pin bonding area of the touch panel. The interlayer insulating layer covers an area other than the first pin bonding area. The second touch electrode layer comprises second touch electrodes, second touch traces and second pins, and the second pins are located in the second pin bonding area of the touch panel.

In some embodiments, the first touch electrode layer, the interlayer insulating layer and the second touch electrode layer are stacked in order on the display panel, and the interlayer insulating layer covers an area other than the first pin bonding area and the display bonding area of the display panel.

In some embodiments, the first touch electrode layer further comprises first display stacking structures one of which is disposed on a display pin of the display panel, and the display pin is located in the display bonding area. The second touch electrode layer further comprises second display stacking structures one of which is disposed on a first display stacking structure of the first touch electrode, and first pin stacking structures one of which is disposed on a first pin of the first touch electrode layer.

In some embodiments, the touch panel further comprises an etch stop layer disposed between the display panel and the first touch electrode layer, and the etch stop layer covers an area other than the display bonding area.

In some embodiments, the touch panel further comprises a protective layer on the second touch electrode layer, and the protective layer covers an area other than the first pin bonding area, the second pin bonding area and the display bonding area.

In some embodiments, the touch panel further comprises a polarizing layer on the protective layer.

BRIEF DESCRIPTION OF THE DRAWINGS

The accompanying drawings described herein are used to provide a further understanding of the present disclosure and constitute a part of the present disclosure. The illustrative embodiments and descriptions serve to explain the present disclosure, but do not constitute a limitation to the present disclosure. In the accompanying drawings.

DETAILED DESCRIPTION

Figure 1:
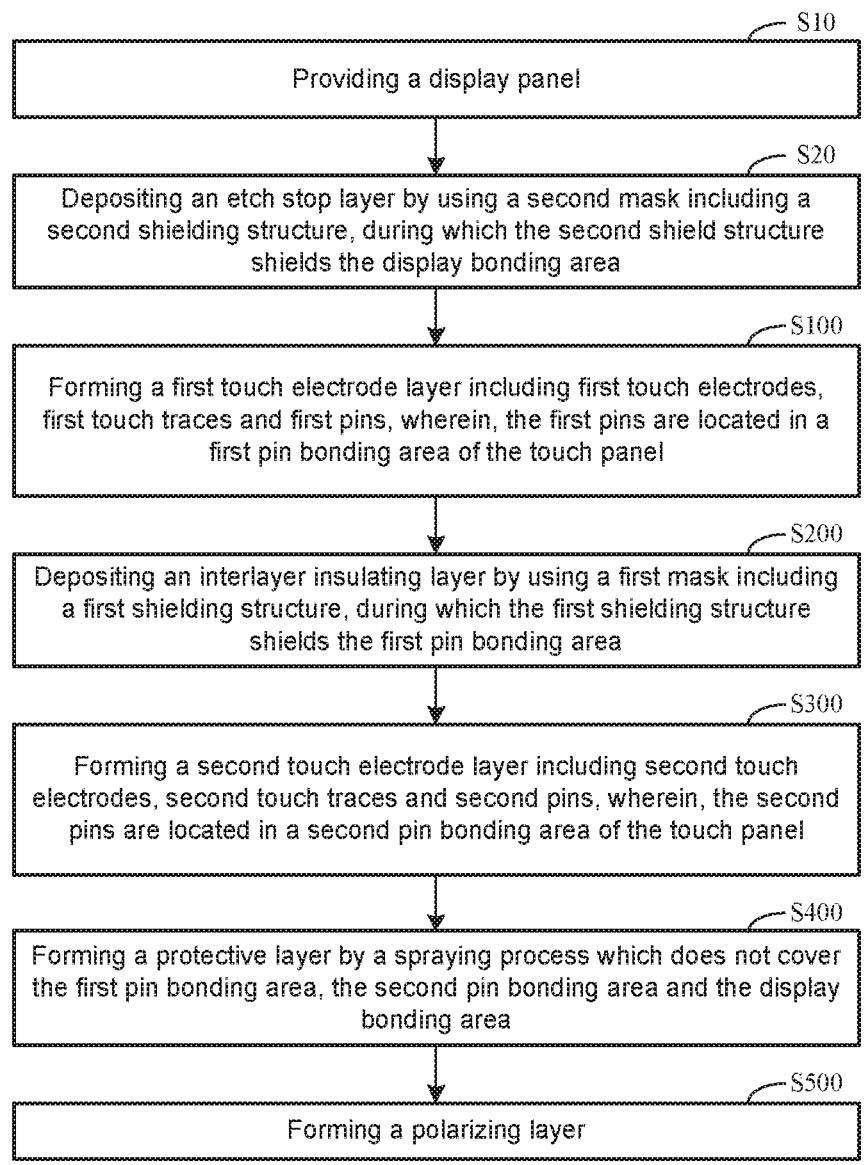
FIG. 1 is a flowchart of a method of manufacturing a touch panel according to some embodiments of the present disclosure.

The technical solutions in the embodiments of the present disclosure will be described clearly and completely with reference to the accompanying drawings in the embodiments of the present disclosure, Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

It should be understood that in the description of the present disclosure, orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, but not to indicate or imply that the referred devices or elements must have a particular orientation, or must be constructed or operated in a particular orientation, Therefore they should not be construed as limitations to the present disclosure.

The terms "first" and "second" are used for descriptive purposes only and are not to be construed as indicating or implying the relative importance or implicitly indicating the number of indicated technical features, Thus, features defined as "first", "second" may explicitly or implicitly include one or more of the features. In the description of the present invention, "a plurality of" means two or more unless otherwise specified.

In the description of the present disclosure, it will be noted that the terms "mounted", "connected", and "connection" should be understood in a broad sense unless specifically defined or limited. For example, it may be a permanent connection, a detachable connection, or it may be an integrated connection. For a person of ordinary skill in the art, the specific meanings of the above terms in the present disclosure can be understood according to specific circumstances.

In order to illustrate a method of manufacturing a touch panel, a touch panel and a touch display device provided by embodiments of the present disclosure, detailed descriptions will be made below with reference to the accompanying drawings.

Referring to FIGS. 1-12, some embodiments of the present disclosure provide a method of manufacturing a touch panel, and the method includes steps 100-300 (S100-S300).

Figure 7:
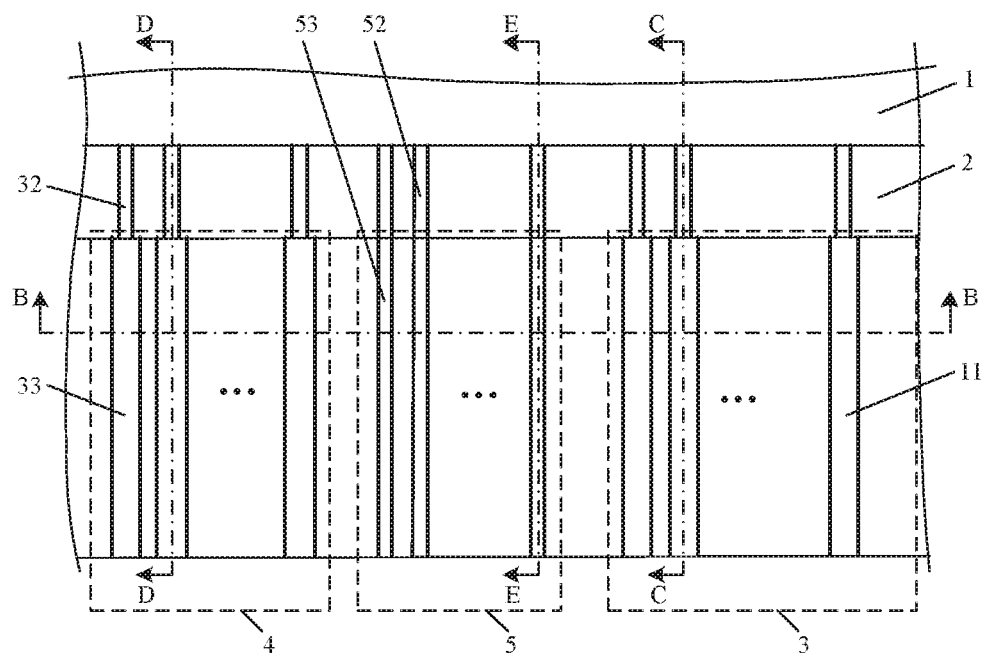
FIG. 7 is an enlarged view of the area A in FIG. 2.
Figure 10:
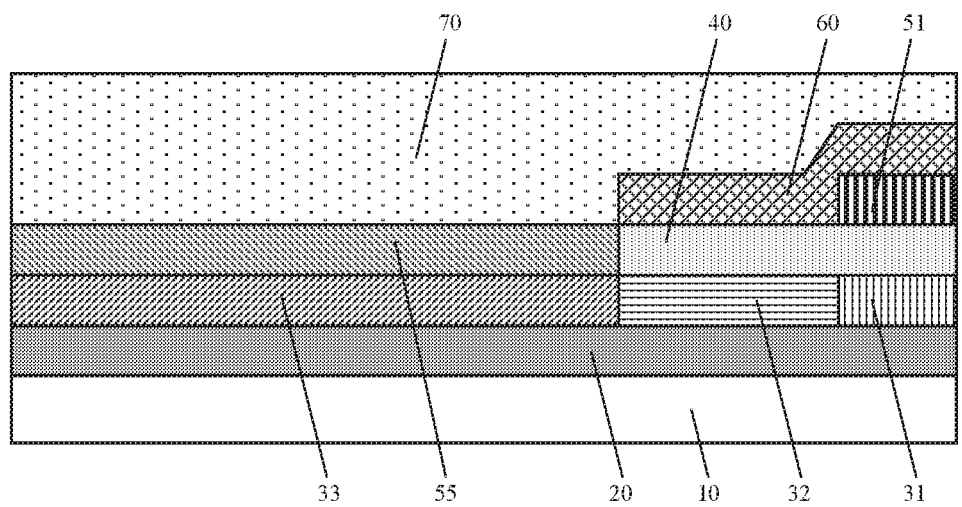
FIG. 10 is a sectional view taken along line D-D in FIG. 7.

In S100, a first touch electrode layer is formed. As shown in FIGS. 7 and 10, the first touch electrode layer includes first touch electrodes 31, first touch traces 32 and first pins 33, and the first pins 33 are located in a first pin bonding area 4 of the touch panel.

Figure 12:
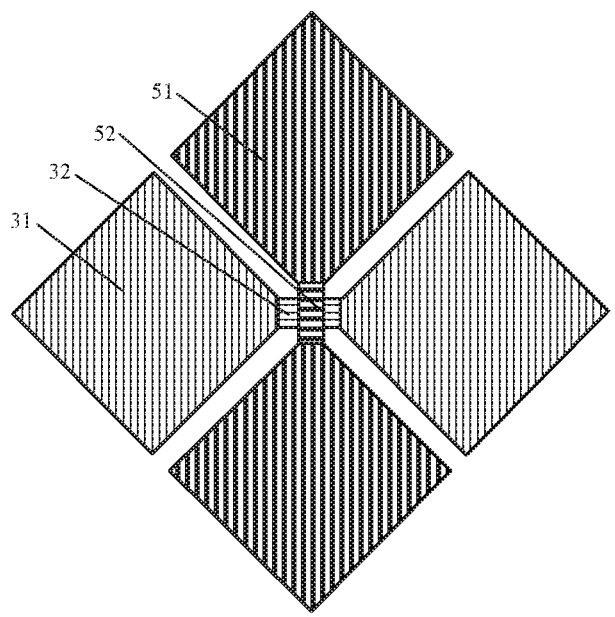
FIG. 12 is a schematic structural diagram of first touch electrodes and second touch electrodes according to some embodiments of the present disclosure.

In some embodiments, during the process of forming the first touch electrode layer, a first material film layer, such as a metal film layer or a metal oxide conductive film layer, is first deposited. The metal film layer is for example a copper film layer. The metal oxide conductive film layer is for example an Indium Tin Oxide (ITO) film layer. Then, a patterning process is performed for the first material film layer to form the first touch electrode layer, that is, the first touch electrodes 31, the first touch traces 32 and the first pins 33 are formed by a patterning process. The first touch electrodes 31 are arranged in an area of the touch panel corresponding to a display area 1 of a display panel and are arranged in an array. The first touch electrodes 31 have for example diamond shapes. Referring to FIG. 12, two adjacent first touch electrodes 31 are connected by a corresponding one of the first touch traces 32 in a lateral direction in this figure. Referring to FIG. 7, at least one of the first touch traces 32 extend into the first pin bonding area 4 of the touch panel through a trace area 2 of the touch panel. In addition, the first pins 33 are disposed in the first pin bonding area 4, and each of the first pins 33 is connected to a corresponding first touch trace 32.

In some embodiments, the step of forming the first touch electrode layer by the patterning process includes: photoresist coating, that is, coating a photoresist on the first material film layer; exposure, that is, covering the photoresist by a mask having a pattern of the first touch electrode layer, and then irradiating the photoresist with light to expose a portion of the photoresist (a unshielded portion of the photoresist) corresponding to a transparent area of the mask; development, that is, removing the exposed portion of the photoresist with a developing solution to expose a portion of the first material film layer corresponding to the exposed portion of the photoresist; etching, that is, etching the exposed portion of the first material film layer by using a removal process such as a dry etching process, a wet etching process or the like; and photoresist removing, that is, removing a residual portion of the photoresist, so as to obtain the first touch electrode layer.

In S200, an interlayer insulating layer 40 is deposited by using a first mask 80 including a first shielding structure 800. The first shielding structure 800 is configured to shield the first pin bonding area 4 during deposition of the interlayer insulating layer 40.

Figure 3:
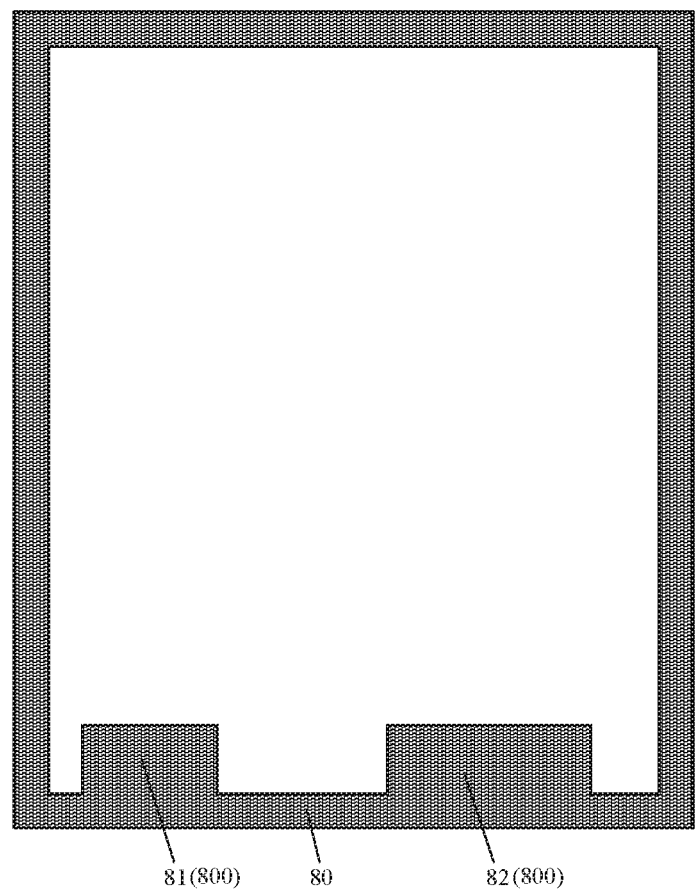
FIG. 3 is a schematic structural diagram of a first mask according to some embodiments of the present disclosure.
Figure 4:
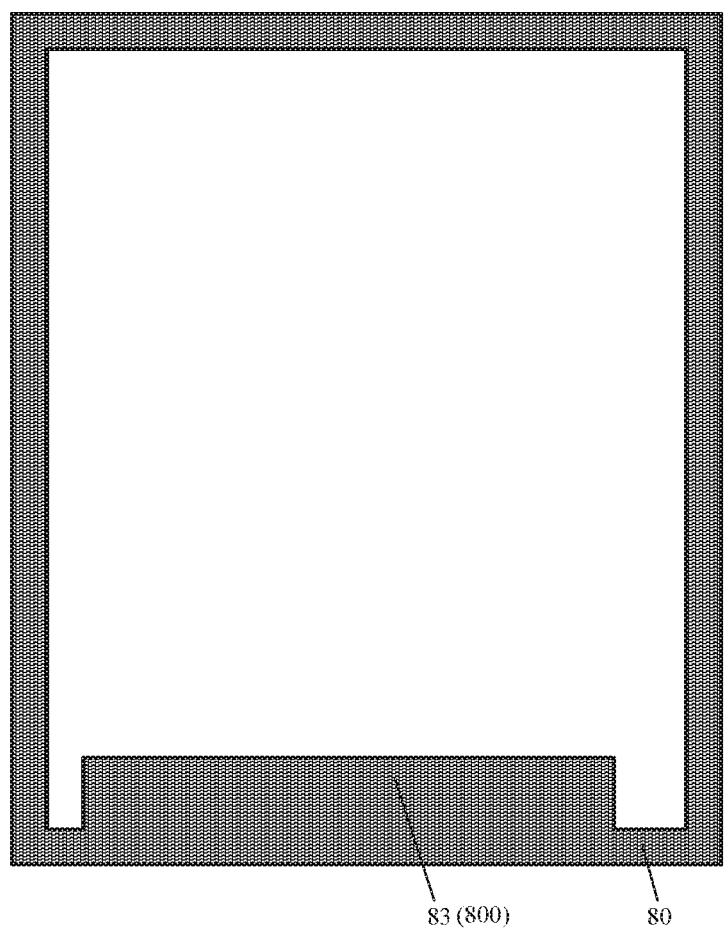
FIG. 4 is a schematic structural diagram of another first mask according to some embodiments of the present disclosure.
Figure 5:
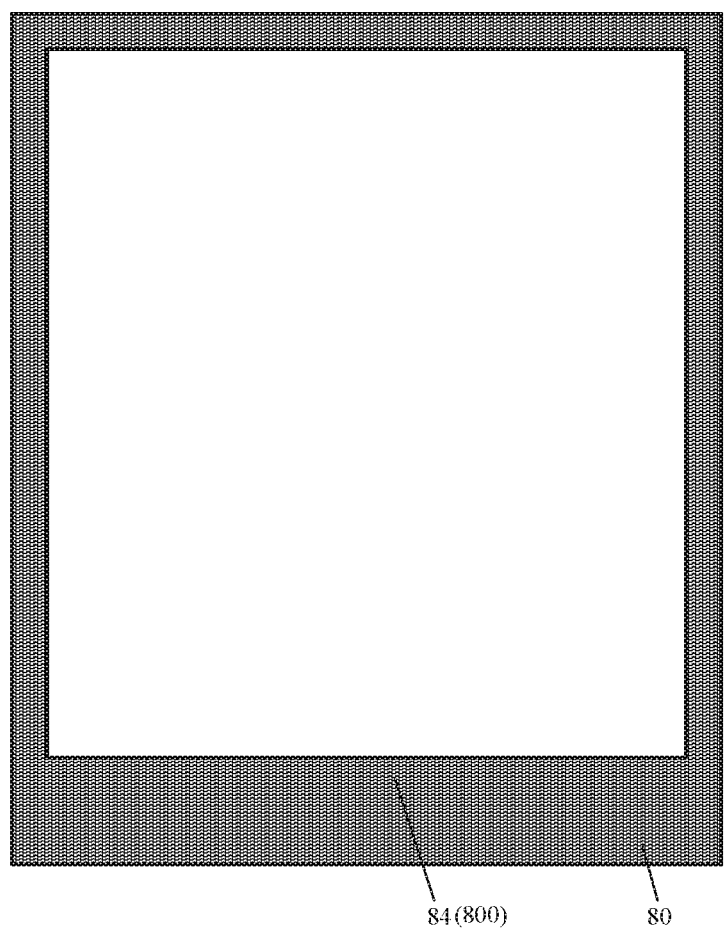
FIG. 5 is a schematic structural diagram of yet another first mask according to some embodiments of the present disclosure.

In some embodiments, the interlayer insulating layer 40 is deposited by using the first mask via a Plasma Chemical Vapor Deposition (PCVD) process or a sputtering process or an evaporation process. The first mask 80 adopts for example a structure as shown in FIG. 3, 4 or 5. In the process of depositing the interlayer insulating layer 40, the first mask 80 is placed on a side of the first touch electrode layer where the interlayer insulating layer 40 is to be deposited, and the first pin bonding area 4 of the touch panel is shielded by the first shielding structure 800 of the first mask 80, that is, a portion of the first touch electrode layer on which the interlayer insulating layer 40 is not necessary to be deposited is shielded by the first shielding structure 800 of the first mask 80. Then the interlayer insulating layer 40 is deposited. Referring to FIG. 10, the interlayer insulating layer 40 covers neither the first pin bonding area 4 nor the first pins 33 in the first pin bonding area 4. In this way, it is not necessary to remove a portion of the interlayer insulating layer corresponding to the first pin bonding area 4 by a patterning process in order to expose the first pins 33 in the subsequent manufacturing method.

Figure 11:
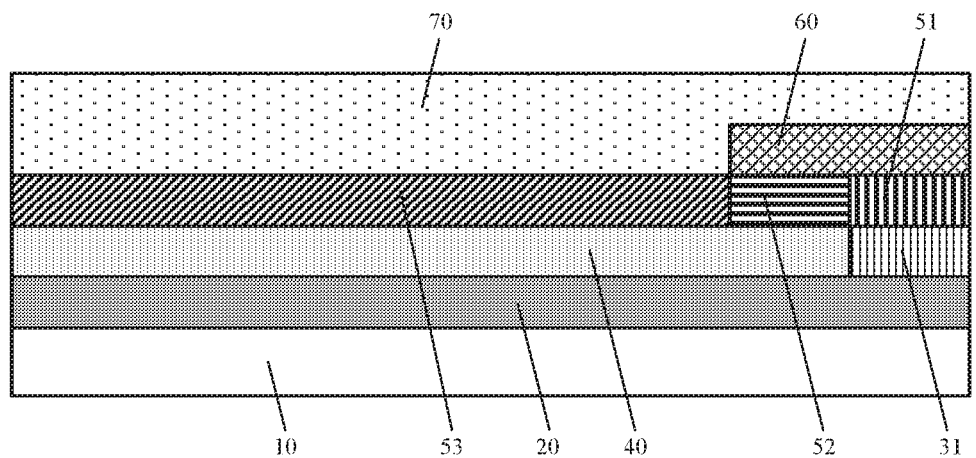
FIG. 11 is a sectional view taken along line E-E in FIG. 7.

In S300, a second touch electrode layer is formed. As shown in FIGS. 7 and 11, the second touch electrode layer includes second touch electrodes 51, second touch traces 52 and second pins 53, and the second pins 53 are located in a second pin bonding area 5 of the touch panel.

In some embodiments, in the process of forming the second touch electrode layer, a second material film layer, such as a metal film layer or a metal oxide conductive film layer, is first deposited. The metal film layer is for example a copper film layer. The metal oxide conductive film layer is for example an Indium Tin Oxide (ITO) film layer. Then, a patterning process is performed for the second material film layer to form the second touch electrode layer, that is, the second touch electrodes 51, the second touch traces 52 and the second pins 53 are formed by a patterning process. The second touch electrodes 51 are located in the area of the touch panel corresponding to the display area of the display panel and are arranged in an array. The second touch electrodes 51 have for example diamond shapes. Referring to FIG. 12, two adjacent second touch electrodes 51 are connected by a corresponding one of the second touch traces 52 in a vertical direction in this figure. Referring to FIG. 7, at least one of the second touch traces 52 extends into the second pin bonding area 5 of the touch panel through the trace area 2 of the touch panel. The second pins 53 are located in the second pin bonding area 5 and each of the second pins 53 is connected to a corresponding second touch trace 52.

In some embodiments, the step of forming the second touch electrode layer by the patterning process includes; photoresist coating, that is, coating a photoresist on the second material film layer; exposure, that is, covering the photoresist by a mask having a pattern of the second touch electrode layer, and then irradiating the photoresist with light to expose a portion of the photoresist corresponding to the transparent area of the mask; development, that is, removing the exposed portion of the photoresist with a developing solution to expose a portion of the second material film layer corresponding to the exposed portion of the photoresist; etching, that is, etching the exposed portion of the second material film layer by using a removal process such as a dry etching process, a wet etching process or the like; and photoresist removing, that is, removing a residual portion of the photoresist, so as to obtain the second touch electrode layer.

In the method of manufacturing the touch panel provided by the embodiments of the present disclosure; since in the process of forming the interlayer insulating layer 40 between the first touch electrode layer and the second touch electrode layer, the first mask 80 including the first shielding structure 800 is used; the interlayer insulating layer 40 covers neither the first pin bonding area 4 nor the first pins 33 in the first pin bonding area 4. Therefore, it is not necessary to expose the first pins 33 by a patterning process subsequently, thereby reducing the process steps in manufacturing the touch panel, and simplifying the process of manufacturing the touch panel.

The shapes of the first touch electrodes 31 and the second touch electrodes 51 can be set according to actual needs. For example; the shapes of the first touch electrodes 31 and the second touch electrodes 51 are triangular, or as shown in FIG. 12, the shapes of the first touch electrodes 31 and the second touch electrodes 51 are diamond shapes.

In the related art, the first touch electrodes 31 and the second touch electrodes 51 are disposed in the same layer; and the connection between two adjacent first touch electrodes 31 or the connection between two adjacent second touch electrodes 51 needs to be achieved by a bridge structure. However, in the method of manufacturing the touch panel provided by the embodiments of the present disclosure, the first touch electrodes 31 and the second touch electrodes 51 are disposed in different layers. Moreover, the first touch electrodes 31 and the first touch traces 32 are formed once by one patterning process to form an integrated structure, and the second touch electrodes 51 and the second touch traces 52 are formed once by one patterning process to form an integrated structure. Therefore, compared with the related art, in the embodiments of the present disclosure, there is no bridging connection point between the first touch electrode 31 and the first touch trace 32, and there is also no bridging connection point between the second touch electrode 51 and the second touch trace 52. In this way, the phenomenon that the first touch electrode 31 is disconnected from the first touch trace 32 and the second touch electrode 51 is disconnected from the second touch trace 52 may be prevented. Especially for the flexible touch panel, the occurrence of the phenomenon that the first touch electrode 31 is disconnected from the first touch trace 32 and the second touch electrode 51 is disconnected from the second touch trace 52 when the flexible touch panel is bent may be prevented, thereby preventing the touch function of the touch panel from being invalid, and further improving the reliability of the touch panel in use.

With continued reference to FIG. 1, in some embodiments, the method of manufacturing the touch panel further includes: S10, providing a display panel.

The display panel is for example an organic light emitting diode (OLED) display panel 10 or a liquid crystal display (LCD) panel. The above display panel can also be a display panel of other types.

The method of manufacturing the touch panel is illustrated below by taking the display panel being an OLED display panel as an example. The related description of the display panel of other types can refers to the description of the OLED display panel, and will not be repeated herein. Referring to FIGS. 7 and 8, in some embodiments, the display panel is an OLED display panel 10, and the OLED display panel 10 is encapsulated by using a thin film encapsulation technology. A thin film encapsulation layer of the OLED display panel 10 does not cover display pins 11 of the OLED display panel 10, that is, the thin film encapsulation layer of the OLED display panel 10 does not cover a display bonding area 3 of the OLED display panel 10 to facilitate the bonding of the display driving chip to the display pins 11. The first touch electrode layer is formed on a side of the thin film encapsulation layer of the OLED display panel 10 facing away from a base substrate of the OLED display panel 10.

After the formation of the first touch electrode layer is completed, and during the process of depositing the interlayer insulating layer 40 by the first mask 80, the first shielding structure 800 of the first mask 80 also shields the display bonding area 3 of the OLED display panel 10. That is, the first shielding structure 800 simultaneously shields the first pin bonding area 4 of the touch panel and the display bonding area 3 of the OLED display panel 10 so that the interlayer insulating layer 40 does not cover the first pin bonding area 4 and the display bonding area 3. In this way, the interlayer insulating layer 40 does not cover the first pins 33 in the first pin bonding area 4 and the display pins 11 in the bonding area 3.

For the OLED display panel 10 encapsulated by the thin film encapsulation technology, the first shielding structure 800 of the first mask 80 also shields the display bonding area 3 when the interlayer insulating layer 40 is formed. That is, the interlayer insulating layer 40 covers neither the display bonding area 3 nor the display pins 11 in the bonding area 3. In this way, it is not necessary to expose the display pins 11 in the display bonding area 3 by a patterning process subsequently, thereby further simplifying the process of manufacturing the touch panel.

The structure of the first shielding structure 800 of the first mask 80 may be various. In some embodiments, as shown in FIG. 3, the first shielding structure 800 is configured to simultaneously shield the first pin bonding area 4 and the display bonding area 3.

In some embodiments, as shown in FIG. 3, the first shielding structure 800 includes a first shielding portion 81 configured to shield the first pin bonding area 4 and a second shielding portion 82 configured to shield the display bonding area 3. In some embodiments, the first shielding portion 81 and the second shielding portion 82 are of an integrated structure with a body of the first mask 80. For example, the first shielding portion 81 and the second shielding portion 82 are fixedly disposed on the body of the first mask 80, for example, by welding or bonding. Alternatively, the first shielding portion 81 and the second shielding portion 81 are integrally formed with the body of the first mask 80, such as by stamping. In some other embodiments, the first shielding portion 81 and the second shielding portion 82 are respectively formed, and the positions and sizes of the first shielding portion 81 and the second shielding portion 82 may be respectively set according to actual needs.

Figure 2:
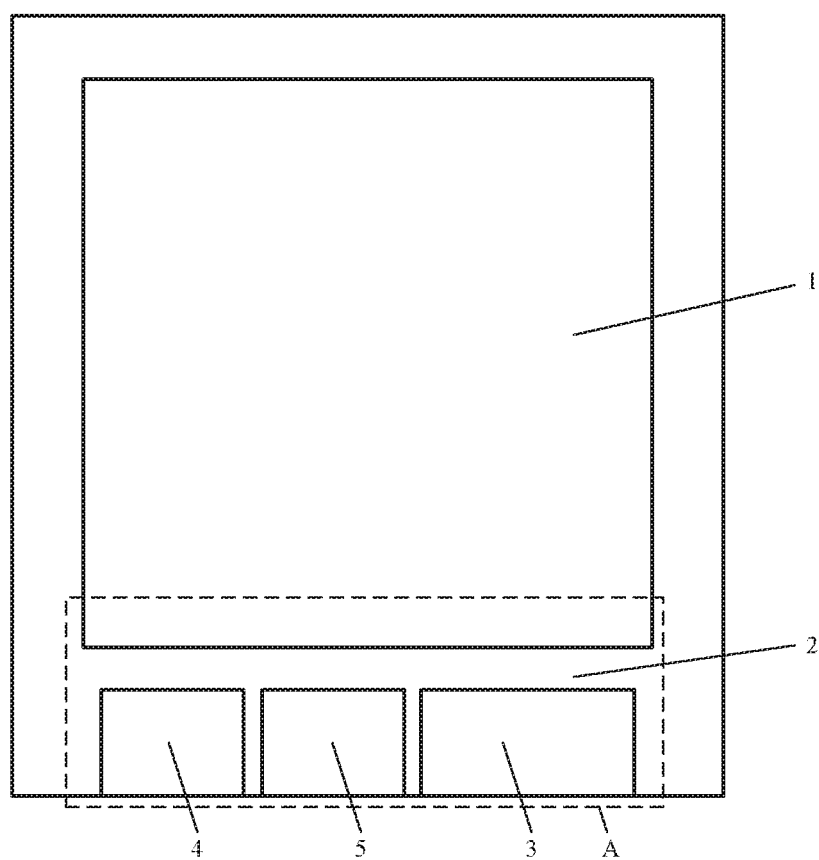
FIG. 2 is a schematic structural diagram of a touch panel according to some embodiments of the present disclosure.

Referring to FIG. 2, in some embodiments, an orthographic projection of the first pin bonding area 4 on the OLED display panel 10 and an orthographic projection of the bonding area 3 on the OLED display panel 10 are located at the same side edge of the OLED display panel 10, and a side of the first pin bonding area 4 adjacent to the display area 1 of the OLED display panel 10 and a side of the display bonding area 3 adjacent to the display area 1 are flush. For example, the orthographic projection of the first pin bonding area 4 on the OLED display panel 10 and the orthographic projection of the display bonding area 3 on the OLED display panel 10 are located at the lower side edge of the OLED display panel 10 shown in FIG. 2, and the side of the first pin bonding area 4 adjacent to the display area 1 of the OLED display panel 10 and the side of the display bonding area 3 adjacent to the display area 1 are flush, that is, the upper side of the first pin bonding area 4 and the upper side of the display bonding area 3 shown in FIG. 2 are flush.

In this case, in some other embodiments, referring to FIG. 4, the first shielding structure 800 includes a third shielding portion 83 configured to simultaneously shield the first pin bonding area 4 and the display bonding area 3. The third shielding portion 83 is disposed on the body of the first mask 80, In some embodiments, as shown in FIG. 4, the third shielding portion 83 is located at the lower side edge of the body of first mask 80, and the lower side of the third shielding portion 83 is fixed to the body of the first mask 80. In addition, the left side and the right side of the third shielding portion 83 do not contact with the body of the first mask 80. In some other embodiments, the third shielding portion 83 and the body of the first mask 80 are of an integrated structure. For example, the third shielding portion 83 is fixedly disposed on the body of the first mask 80, such as by welding or bonding. Alternatively, the third shielding portion 83 is integrally formed with the body of the first mask 80, such as by stamping. In this way, the number of shielding portions in the first shielding structure 800 may be reduced, thereby simplifying the structures of the first mask 80.

Referring to FIG. 2, in some embodiments, the orthographic projection of the first pin bonding area 4 on the OLED display panel 10 and the orthographic projection of the display bonding area 3 on the OLED display panel 10 are located at the same side edge of the OLED display panel 10, and the side of the first pin bonding area 4 adjacent to the display area 1 of the OLED display panel 10 and the side of the display bonding area 3 adjacent to the display area 1 are flush.

In this case, in some other embodiments, referring to FIG. 5, the first shielding structure 800 includes a fourth shielding portion 84 configured to simultaneously shield the first pin bonding area 4 and the display bonding area 3. The fourth shielding portion 84 is disposed on the body of the first mask 80. In some embodiments, the fourth shielding portion 84 is located at the lower side edge of the body of the first mask 80, as shown in FIG. 5, and the lower side of the fourth shielding portion 84 is fixed to the body of the first mask 80.

In addition, the left side and the right side of the fourth shielding portion 84 respectively extend to the left side and the right side of the body of the first mask 80. In some other embodiments, the fourth shielding portion 84 and the body of the first mask 80 are of an integrated structure. For example, the fourth shielding portion 84 is fixedly disposed on the body of the first mask 80, such as by welding or bonding. Alternatively, the fourth shielding portion 84 is integrally formed with the body of the first mask 80, such as by stamping. In this way, the three sides of the fourth shielding portion 84 are all fixed to the body of the first mask 80, thereby reducing the probability of deformation of the first mask 80, and preventing the position of the interlayer insulating layer 40 from changing.

In some embodiments, both the orthographic projection of the first pin bonding area 4 on the OLED display panel 10 and the orthographic projection of the display bonding area 3 on the OLED display panel 10 are located at the same side edge of the OLED display panel 10, and an orthographic projection of the second pin bonding area 5 on the OLED display panel 10 is located at a different side edge of the OLED display panel 10 than the orthographic projections of the first pin bonding area 4 on the OLED display panel 10 and the display bonding area 3 on the OLED display panel 10.

In some other embodiments, referring to FIG. 2, the orthographic projection of the second pin bonding area 5 on the OLED display panel 10 and the orthographic projections of the first pin bonding area 4 and the display bonding area 3 on the OLED display panel 10 are located at the same side edge of the OLED display panel 10. In the above case, the side of the first pin bonding area 4 adjacent to the display area 1 of the OLED display panel 10, a side of the second pin bonding area 5 adjacent to the display area 1 of the OLED display panel 10, and the side of the display bonding area 3 adjacent to the display area 1 are flush, that is, the upper side of the first pin bonding area 4, a upper side of the second pin bonding area 5 and the upper side of the display bonding area 3 as shown in FIG. 2 are flush. Referring to FIG. 4 or 5, the third shielding portion 83 or the fourth shielding portion 84 of the first shielding structure 800 is configured to simultaneously shield the first pin bonding area 4, the second pin bonding area 5 and the display bonding area 3. In the process of depositing the interlayer insulating layer 40 by using the first mask 80 including the first shielding structure 800, the interlayer insulating layer 40 does not cover the first pin bonding area 4, the second pin bonding area 5 and the display bonding area 3.

Figure 8A:
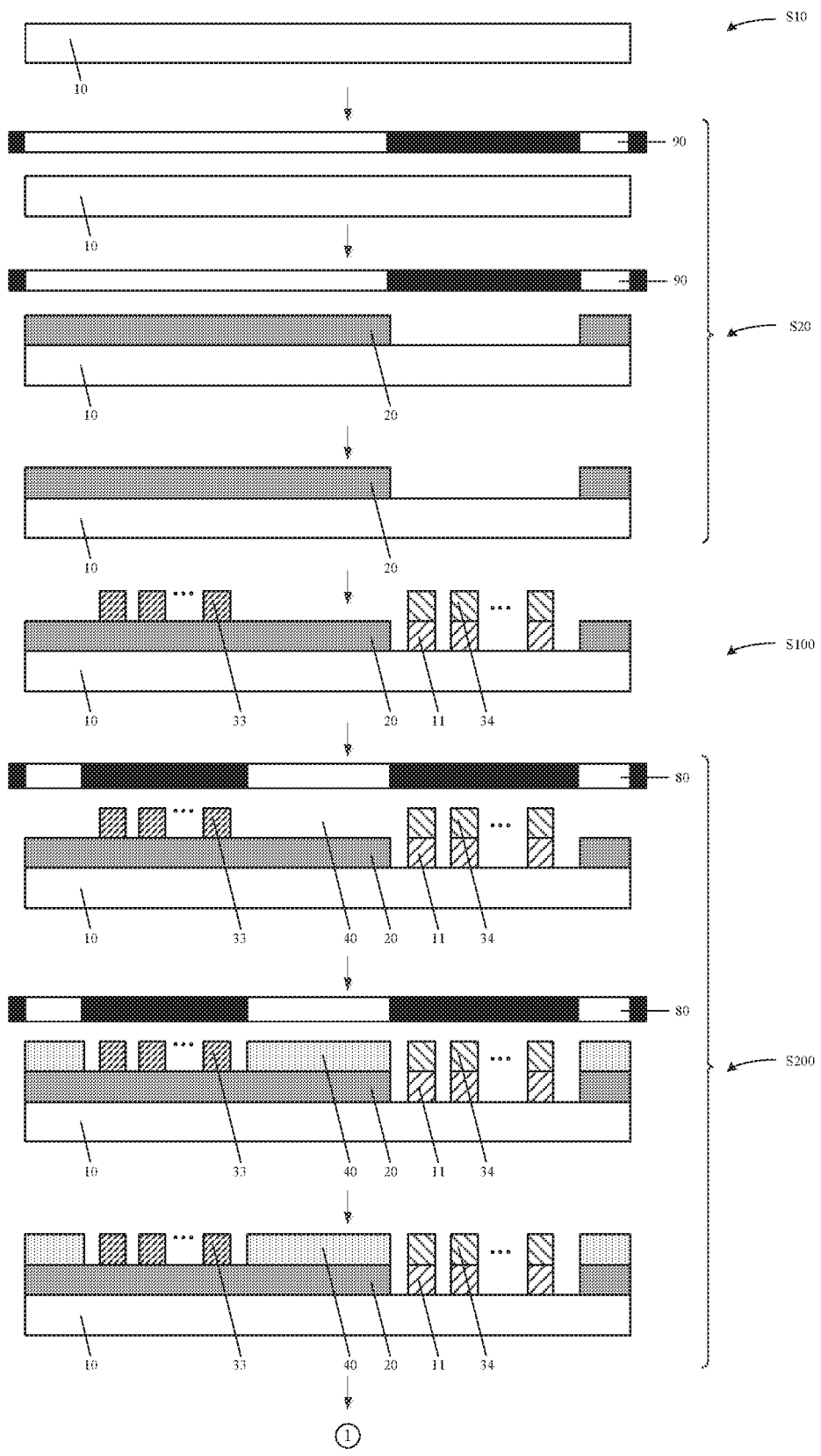
FIGS. 8A and 8B are sectional views taken along line B-B in FIG. 7, and shows the method of manufacturing the touch panel according to some embodiments of the present disclosure.
Figure 8B:
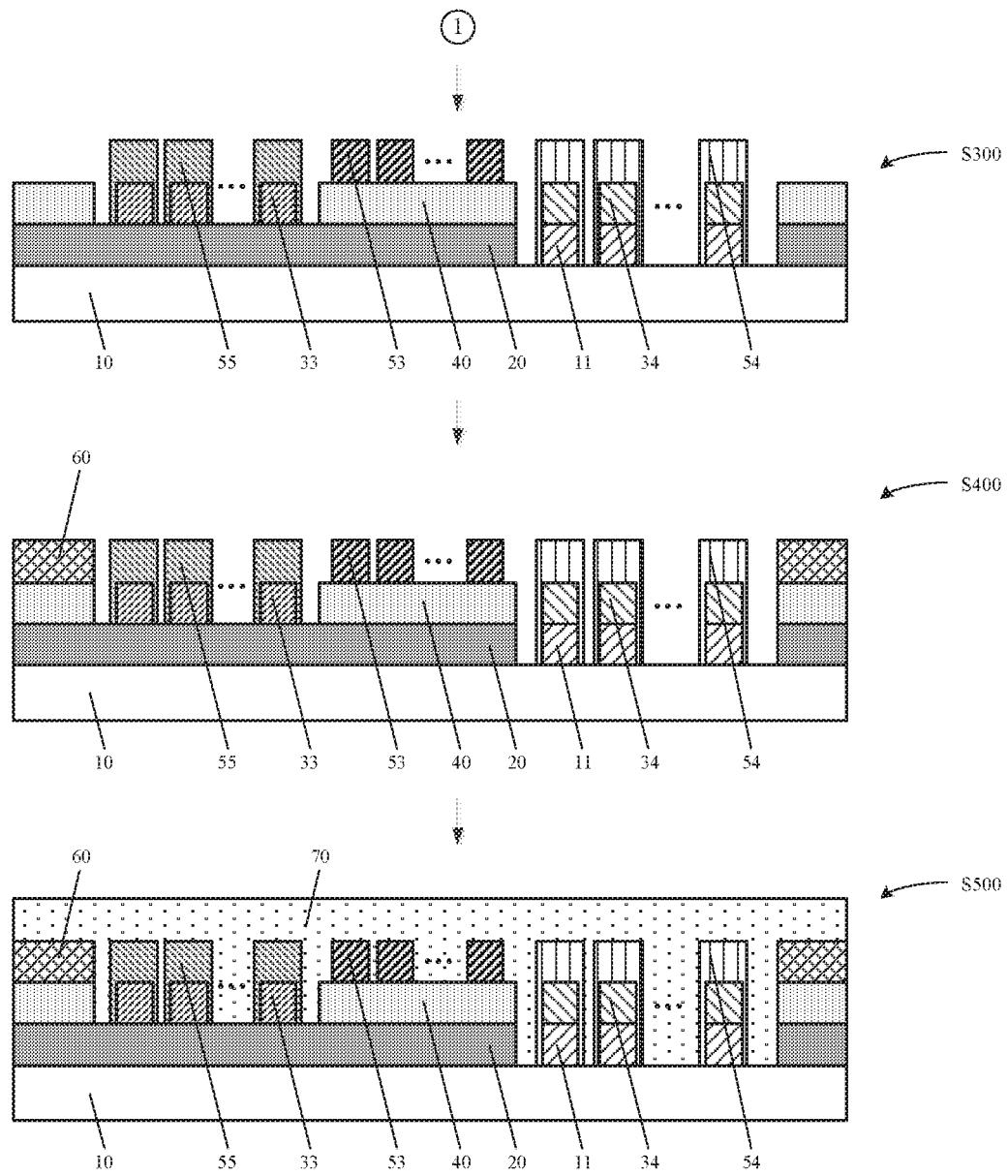
Figure 9:
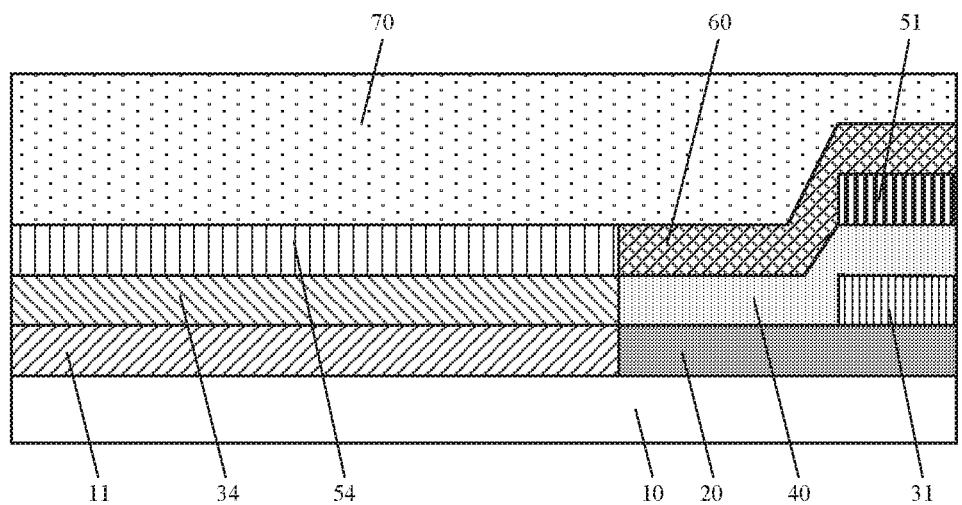
FIG. 9 is a sectional view taken along line C-C in FIG. 7.

Referring to FIGS. 7-9, in some embodiments, the first touch electrode layer further includes first display stacking structures 34, one of which is disposed on a display pin 11 of the OLED display panel 10, and the display pin 11 is located in the display bonding area 3.

Referring to FIGS. 7-10, in some embodiments, the second touch electrode layer further includes second display stacking structures 54 and first pin stacking structures 55, one of the second display stacking structures 54 is disposed on a first display stacking structure 34, and one of the first pin stacking structures 55 is disposed on a first pin 33.

In the above case, S100, forming the first touch electrode layer includes simultaneously forming the first touch electrodes 31, the first touch traces 32, the first pins 33 and the first display stacking structures 34. Referring to FIGS. 8 and 9, in some embodiments, each of the first display stacking structures 34 is located on a corresponding display pin 11 in the display bonding area 3, and the shape of the first display stacking structure 34 is the same as the shape of the display pin 11. S300, forming the second touch electrode layer includes simultaneously forming the second touch electrodes 51, the second touch traces 52, the second pins 53, the second display stacking structures 54 and the first pin stacking structures 55. Referring to FIGS. 8-9, in some embodiments, each of the second display stacking structures 54 is located on a corresponding first display stacking structure 34 in the display bonding area 3. Referring to FIGS. 8-10, each of the first pin stacking structures 55 is located on a corresponding first pin 33 in the first trace bonding area.

In the above case, the subsequent bonding of the display pins 11 and the display driving chip is achieved by bonding the display driving chip and the surfaces of the second display stacking structures 54 facing away from the OLED display panel 10. The subsequent bonding of the first pins 33 and the touch driving chip is achieved by bonding the touch driving chip and the surfaces of the first pin stacking structures 55 facing away from the OLED display panel 10, and the subsequent bonding of the second pins 53 and the touch driving chip is achieved by bonding the touch driving chip and the surfaces of the second pins 53 facing away from the OLED display panel 10. Besides, since the surfaces of the second display stacking structures 54 facing away from the OLED display panel 10, the surfaces of the first pin stacking structures 55 facing away from the OLED display panel 10 and the surfaces of the second pins 53 facing away from the OLED display panel 10 are substantially on the same plane, the subsequent bonding process may be facilitated.

Referring to FIGS. 8A and 8B, in S200, depositing the interlayer insulating layer 40 by using the first mask 80, since there is usually a certain gap between the first mask 80 and the OLED display panel 10, when the interlayer insulating layer 40 is deposited, the material of the interlayer insulating layer may cover the portion of the display bonding area 3 adjacent to the display area 1 to form a transition area covered with a few materials of the interlayer insulating layer, which may cause a portion of the first display stacking structure 34 adjacent to the bonding area to be covered by the material of the interlayer insulating layer 40, and thus the exposed area of the first display stacking structure 34 may be reduced. In order to increase the contact area between the second display stacking structure 54 and the first display stacking structure 34, with continued reference to FIGS. 8A and 8B, in some embodiments, the second display stacking structure 54 covers outer surfaces of the first display stacking structure 34, including a surface of the first display stacking structure 34 facing away from the OLED display panel 10, and two side surfaces of the first display stacking structure 34 adjoining the surface facing away from the OLED display panel 10. That is, the second display stacking structure 54 covers the upper surface, the left side surface and the right side surface of the first display stacking structure 34 as shown in FIGS. 8A and 8B, or the second display stacking structure 54 surrounds the first display stacking structure 34. In this way, the contact area between the second display stacking structure 54 and the first display stacking structure 34 is increased, so that the electrical conductivity between the second display stacking structure 54 and the first display stacking structure 34 may be improved, thereby increasing the electrical conductivity between the display pin 11 and the display driving chip.

With continued reference to FIGS. 8A and 8B, in some embodiments, the first pin stacking structure 55 covers a surface of the first pin 33 facing away from the OLED display panel 10 and two side surfaces of the first pin 33 adjoining the surface facing away from the OLED display panel 10. In other words, the first pin stacking structure 55 covers an upper surface, a left side surface and a right side surface of the first pin 33 as shown in FIGS. 8A and 8B, that is, the first pin stacking structure 55 surrounds the first pin 33. In this way, the contact area between the first pin stacking structure 55 and the first pin 33 may be increased, so that the electrical conductivity between the first pin stacking structure 55 and the first pin 33 may be improved.

Referring to FIGS. 1 and 8, in some embodiments, after S10, providing the display panel, and before S100, forming the first touch electrode layer, the method of manufacturing the touch panel further includes: S20, depositing an etch stop layer 20 by using a second mask. The second mask includes a second shielding structure 91 configured to shield the display bonding area 3.

Figure 6:
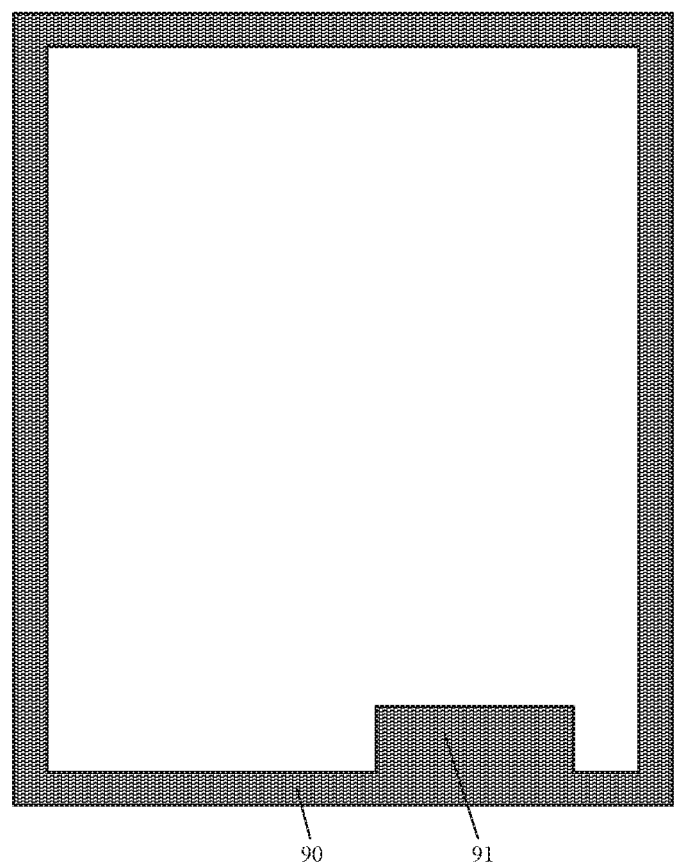
FIG. 6 is a schematic structural diagram of a second mask according to some embodiments of the present disclosure.

In S20, the etch stop layer 20 is deposited by using the second mask 90 via a film forming process such as a Plasma Chemical Vapor Deposition (PCVD) process or a sputtering process or an evaporation process, or the like. The second mask 90 adopts for example a structure as shown in FIG. 6. The second shielding structure 91 is disposed on a body of the second mask 90. For example, in FIG. 6, the second shielding structure 91 is located at the lower side edge of the body of the second mask 90, and the lower side of the second shielding structure 91 is fixed to the body of the second mask 90. In some embodiments, the second shielding structure 91 and the body of the second mask 90 are an integrated structure. For example, the second shielding structure 91 is fixedly disposed on the body of the second mask 90, for example, by welding or bonding. Alternatively, the second shielding structure 91 is integrally formed with the body of the second mask 90, for example, by stamping.

during the process of depositing the etch stop layer 20, the second mask 90 is placed on a side of the OLED display panel 10 where the thin film encapsulation layer is disposed, so that the display bonding area 3 is shielded by the second shielding structure 91 of the second mask 90, and then the etch stop layer 20 is deposited. The formed etch stop layer 20 covers neither the display bonding area 3 nor the display pins 11 in the display bonding area 3. In the subsequent manufacturing method, it is not necessary to remove a portion of the etch stop layer 20 corresponding to the display bonding area 3 by a patterning process to expose the display pins 11. The etch stop layer 20 may prevent the etching process used in forming the first touch electrode layer from adversely affecting the thin film encapsulation layer of the OLED display panel 10.

The material of the etch stop layer 20 is for example an inorganic material, that is, the etch stop layer 20 is an etch stop layer 20 made of an inorganic material. The inorganic material is for example silicon nitride (SiNx), silicon oxide (SiOx), or the like to increase the stop ability of the etch stop layer 20.

Before forming the first touch electrode layer, an etch stop layer 20 may be formed on the thin film encapsulation layer of the OLED display panel 10 to enhance the protection of the OLED display panel 10. In some other embodiments, no etch stop layer 20 is formed on the thin film encapsulation layer of the OLED display panel 10, however, the thickness of the thin film encapsulation layer of the OLED display panel 10 is increased to enhance the abilities of water resistance and oxygen resistance of the thin film encapsulation layer, preventing the etching process used in forming the first touch electrode layer from adversely affecting the thin film encapsulation layer of the OLED display panel 10.

With continued reference to FIGS. 1 and 8, in some embodiments, after S300, forming the second touch electrode layer, the method of manufacturing the touch panel further includes: S400, forming a protective layer 60 by a spraying process. The protective layer does not cover the first pin bonding area 4, the second pin bonding area 5 and the display bonding area 3.

The material of the protective layer 60 is for example an organic material. When the protective layer 60 is formed by the spraying process, the amount of the material of the protective layer 60, the spray boundary and the boundary of the final liquid flow are determined according to the physical properties of the material of the protective layer 60, such as fluidity or the like, and the thickness and spray range of the protective layer 60 to prevent the material of the protective layer 60 from flowing to the first pin bonding area 4, the second pin bonding area 5 and the display bonding area 3, that is, to ensure that the protective layer 60 does not cover the first pin bonding area 4, the second pin bonding area 5 and display bonding area 3. Therefore, the protective layer 60 does not cover the first pins 33, the second pins 53 and the display pins 11, and the protective layer 60 exposes the first pins 33, the second pins 53 and the display pins 11 while protecting the second touch electrodes 51 and the second touch traces 52. In this way, the need to remove portions of the protective layer 60 disposed in the first pin bonding area 4, the second pin bonding area 5 and the display bonding area 3 by the patterning process in the subsequent process may be avoided, thereby further reducing the process steps in manufacturing the touch panel, and simplifying the process of manufacturing the touch panel. In addition, the protective layer 60 may also perform a flattening function to prevent optical problems caused by unevenness of the second touch electrode layer when a polarizing layer is formed subsequently.

With continued reference to FIGS. 1 and 8, in some embodiments, after S400, forming the protective layer, the method of manufacturing the touch panel further includes: step S500, forming a polarizing layer 70.

Referring to FIGS. 8-11, the polarizing layer 70 is used to reduce the reflection of ambient light by a cathode of a metal material, a first touch electrode layer of a metal material and/or a second touch electrode layer of a metal material in the OLED display panel 10, so that the contrast of the touch display device composed of the touch panel and the OLED display panel 10 when a screen is displayed may be prevented from being lowered.

In S500, the process of forming the polarizing layer 70 is, for example, a coating process or a lamination process. By using the coating process, a thinner polarizing layer may be formed. In addition, when the touch panel is applied to a flexible touch display device, the polarizing layer formed by using the coating process has a strong anti-fold ability, thereby improving the reliability of the touch panel in use.

The material of the interlayer insulating layer 40 can be selected according to actual needs. For example, the material of the interlayer insulating layer 40 is an inorganic material such as silicon nitride (SiNx), silicon oxide (SiOx) or the like. In this way, the thickness of the interlayer insulating layer 40 may be made thinner, so that the distance between the first touch electrode 31 and the second touch electrode 51 may be reduced, and the occurrence of the phenomenon that the capacitance value between the first touch electrode 31 and the second touch electrode 51 is deviated is reduced. When the touch panel is applied to the flexible touch display device, the occurrence of the phenomenon that the capacitance value is deviated due to the misalignment between the first touch electrode 31 and the second touch electrode 51 after a long-term bending may be reduced.

In some other examples, the material of the interlayer insulating layer 40 is an organic material. In this way, the ability of bending resistance of the interlayer insulating layer 40 may be enhanced, and the occurrence of the phenomenon that the interlayer insulating layer 40 is broken due to bending may be prevented.

In some embodiments, the first touch electrode 31 is a touch transmitting electrode, and the second touch electrode 51 is a touch sensing electrode. In this case, the touch sensing electrode is away from the OLED display panel 10 relative to the touch transmitting electrode, thereby preventing the potential of each electrode in the OLED display panel 10 from adversely affecting the touch sensing electrode, and further improving the reliability of the touch panel in use.

The material of the first touch electrode layer and the material of the second touch electrode layer can be selected according to actual needs. In some embodiments, the materials of the first touch electrode layer and the second touch electrode layer are metals, metal oxide conductive materials, or the like. By selecting metals as the materials of the first touch electrode layer and the second touch electrode layer, the electrical conductivities of the first touch electrode layer and the second touch electrode layer are both high, and the reliability of the touch panel in use is improved.

With continued reference to FIGS. 2-11, some embodiments of the present disclosure provide a touch panel manufactured by the above method of manufacturing the touch panel. The touch panel includes a first touch electrode layer, an interlayer insulating layer 40 and a second touch electrode layer formed in order. The first touch electrode layer includes first touch electrodes 31, first touch traces 32 and first pins 33, and the first pins 33 are located in the first pin bonding area 4 of the touch panel. The interlayer insulating layer 40 does not cover the first pin bonding area 4. The second touch electrode layer includes second touch electrodes 51, second touch traces 52 and second pins 53, and the second pins 53 are located in the second pin bonding area 5 of the touch panel.

The touch panel has the same advantages as the method of manufacturing the touch panel described above relative to the related art, which will not be elaborated here.

Referring to FIGS. 8-11, in some embodiments, the first touch electrode layer, the interlayer insulating layer 40 and the second touch electrode layer are formed in order on the display panel 10. The display panel 10 is for example a liquid crystal display panel, an organic light emitting diode (OLED) display panel, or the like. The touch panel is illustrated below by taking the display panel 10 being the OLED display panel 10. The OLED display panel is encapsulated by the thin film encapsulation technology, and the interlayer insulating layer 40 does not cover the display bonding area 3 of the OLED display panel 10, In this way, the interlayer insulating layer 40 does not cover the display pins 11 located in the display bonding area 3 either, and it is not necessary to expose the display pins 11 in the display bonding area 3 by a patterning process.

With continued reference to FIGS. 8-11, in some embodiments, the first touch electrode layer further includes first display stacking structures 34 one of which is disposed on a display pin 11 of the OLED display panel 10, and the display pin 11 is located in the display bonding area 3. In some embodiments, the second touch electrode layer further includes second display stacking structures 54 one of which is disposed on a first display stacking structure 34, and first pin stacking structures 55 one of which is disposed on a first pin 33. The subsequent bonding of the display pins 11 and the display driving chip is achieved by bonding the display driving chip and the surfaces of the second display stacking structures 54 facing away from the OLED display panel 10. The subsequent bonding of the first pins 33 and the touch driving chip is achieved by bonding the touch driving chip and the surfaces of the first pin stacking structures 55 facing away from the OLED display panel 10, and the subsequent bonding of the second pins 53 and the touch driving chip is achieved by bonding the touch driving chip and the surfaces of the second pins 53 facing away from the OLED display panel 10. Since the surfaces of the second display stacking structures 54 facing away from the OLED display panel 10, the surfaces of the first pin stacking structures 55 facing away from the OLED display panel 10 and the surfaces of the second pins 53 facing away from the OLED display panel 10 are substantially on the same plane, the subsequent bonding process may be facilitated.

With continued reference to FIGS. 8-11, in some embodiments, the second display stacking structure 54 covers the surface of the first display stacking structure 34 facing away from the OLED display panel 10 and the two side surfaces of the first display stacking structure 34 adjoining the surface facing away from the OLED display panel 10. The first pin stacking structure 55 covers the surface of the first pin 33 facing away from the OLED display panel 10 and the two side surfaces of the first pin 33 adjoining the surface facing away from the OLED display panel 10. In this way, the contact area between the second display stacking structure 54 and the first display stacking structure 34 and the contact area between the first pin stacking structure 55 and the first pin 33 may be increased, thereby improving the electrical conductivity between the second display stacking structure 54 and the first display stacking structure 34, and improving the electrical conductivity between the first pin stacking structure 55 and the first pin 33.

Referring to FIGS. 8A and 8B, in some embodiments, the touch panel further includes an etch stop layer 20 between the OLED display panel 10 and the first touch electrode layer, and the etch stop layer 20 does not cover the display bonding area 3, that is, there is no etch stop layer 20 in the display bonding area 3. The material of the etch stop layer 20 is for example an inorganic material. The etch stop layer 20 may prevent the etching process used in forming the first touch electrode layer from adversely affecting the thin film encapsulation layer of the OLED display panel 10.

With continued reference to FIGS. 8A and 8B, in some embodiments, the touch panel further includes a protective layer 60 disposed on a surface of the second touch electrode layer facing away from the first touch electrode layer, and the protective layer 60 does not cover the first pin bonding area 4, the second pin bonding area 5 and the display bonding area 3, that is, the protective layer 60 does not exist in the first pin bonding area 4, the second pin bonding area 5 and the display bonding area 3. In addition, the protective layer 60 is configured to protect the second touch electrode layer.

With continued reference to FIGS. 8A and 8B, in some embodiments, the touch panel further includes a polarizing layer 70 which is disposed on a surface of the protective layer 60 facing away from the second touch electrode layer. The polarizing layer 70 is used to reduce the reflection of the ambient light by a cathode of a metal material, a first touch electrode layer of a metal material and/or a second touch electrode layer of a metal material in the OLED display panel 10, so that the contrast of the touch display device when a screen is displayed can be prevented from being lowered.

Some embodiments of the present disclosure provide a touch display device including the touch panel as described above.

The touch display device has the same advantages as the touch panel described above relative to the related art, which will not be elaborated here.

In the descriptions of the above embodiments, specific features, structures, materials or features can be combined in any suitable manner in any one or more embodiments or examples.

The foregoing descriptions are merely implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A method of manufacturing a touch panel, comprising:
   providing a display panel;
   forming a first touch electrode layer comprising first touch electrodes, first touch traces and first pins, wherein, the first pins are located in a first pin bonding area of the touch panel;
   forming an interlayer insulating layer by using a first mask comprising only one opening and a first shielding structure located at a side of the opening, during which the first shielding structure shields the first pin bonding area and a display bonding area of the display panel, and the opening exposes at least one whole first touch electrode and at least one whole first touch trace, wherein the first mask is not a portion of the touch panel; and
   forming a second touch electrode layer comprising second touch electrodes, second touch traces and second pins, wherein, the second pins are located in a second pin bonding area of the touch panel;
   the first touch electrode layer further comprises first display stacking structures, a first display stacking structure of which is disposed on a display pin of the display panel, and the display pin is located in the display bonding area; and/or,
   the second touch electrode layer further comprises: second display stacking structures, a second display stacking structure of which is disposed on a first display stacking structure of the first touch electrode layer; and first pin stacking structures, a first pin stacking structure of which is disposed on a first pin of the first touch electrode layer.

2. The method of manufacturing the touch panel according to claim 1, wherein,
   the first shielding structure comprises a first shielding portion configured to shield the first pin bonding area, and a second shielding portion configured to shield the display bonding area, or
   the first shielding structure comprises a third shielding portion configured to simultaneously shield the first pin bonding area and the display bonding area.

3. The method of manufacturing the touch panel according to claim 1, wherein,
   an orthographic projection of the first pin bonding area on the display panel and an orthographic projection of the display bonding area on the display panel are located at a same side edge of the display panel, and a side of the first pin bonding area adjacent to a display area of the display panel and a side of the display bonding area adjacent to the display area are flush.

4. The method of manufacturing the touch panel according to claim 1, wherein
   the first touch electrode layer further comprises first display stacking structures, a first display stacking structure of which is disposed on a display pin of the display panel; and the second touch electrode layer further comprises: second display stacking structures, a second display stacking structure of which is disposed on a first display stacking structure of the first touch electrode layer; and first pin stacking structures, a first pin stacking structure of which is disposed on a first pin of the first touch electrode layer,
   the second display stacking structure covers a surface of the first display stacking structure facing away from the display pin, and side surfaces of the first display stacking structure adjoining the surface of the first display stacking structure, and
   the first pin stacking structure covers a surface of the first pin facing away from the display panel, and side surfaces of the first pin adjoining the surface of the first pin.

5. The method of manufacturing the touch panel according to claim 1, wherein, after providing the display panel and before forming the first touch electrode layer, the method further comprises:
   forming an etch stop layer by using a second mask comprising a second shielding structure, during which the second shield structure shields the display bonding area, and the second mask is not a portion of the touch panel.

6. The method of manufacturing the touch panel according to claim 5, wherein, the etch stop layer is made of an inorganic material.

7. The method of manufacturing the touch panel according to claim 1, wherein, after forming the second touch electrode layer, the method further comprises:
   forming a protective layer which covers an area of the touch panel other than the first pin bonding area, the second pin bonding area and the display bonding area by using a spraying process.

8. The method of manufacturing the touch panel according to claim 7, wherein, after forming the protective layer, the method further comprises:
   forming a polarizing layer.

9. The method of manufacturing the touch panel according to claim 8, wherein, a process of forming the polarizing layer is a coating process.

10. The method of manufacturing the touch panel according to claim 1, wherein, the first touch electrodes are touch transmitting electrodes, and the second touch electrodes are touch sensing electrodes.

11. A mask used in the method of manufacturing the touch panel according to claim 1, the mask comprising only one opening configured to expose at least one whole first touch electrode and at least one whole first touch trace during formation of the interlayer insulating layer, and the first shielding structure that is disposed at the side of the opening and configured to shield the first pin bonding area and the display bonding area of the touch panel during the formation of the interlayer insulating layer,
   wherein the mask is not a portion of the touch panel.

12. A touch panel manufactured by the method of manufacturing the touch panel according to claim 1, the touch panel comprising the first touch electrode layer, the interlayer insulating layer and the second touch electrode layer which are formed in order, wherein, the first touch electrode layer comprises first touch electrodes, first touch traces and first pins, and the first pins are located in a first pin bonding area of the touch panel;

the interlayer insulating layer covers an area of the first touch electrode layer other than the first pin bonding area;

the second touch electrode layer comprises second touch electrodes, second touch traces and second pins, and the second pins are located in a second pin bonding area of the touch panel;

the first touch electrode layer further comprises first display stacking structures one of which is disposed on a display pin of the display panel, and the display pin is located in the display bonding area;

the second touch electrode layer further comprises: second display stacking structures one of which is disposed on a first display stacking structure of the first touch electrode; and first pin stacking structures one of which is disposed on a first pin of the first touch electrode layer.

13. The touch panel according to claim 12, wherein, the first touch electrode layer, the interlayer insulating layer and the second touch electrode layer are stacked in order on the display panel; and the interlayer insulating layer covers an area other than the first pin bonding area and the display bonding area of the display panel.

14. The touch panel according to claim 13, further comprising an etch stop layer disposed between the display panel and the first touch electrode layer, the etch stop layer covering an area other than the display bonding area.

15. The touch panel according to claim 13, further comprising a protective layer on the second touch electrode layer, the protective layer covering an area of the touch panel other than the first pin bonding area, the second pin bonding area and the display bonding area.

16. The touch panel according to claim 15, further comprising a polarizing layer on the protective layer.

* * * * *